United States Patent [19]
Kaji et al.

[11] Patent Number: 5,650,043
[45] Date of Patent: Jul. 22, 1997

[54] ETCHING METHOD USING NH$_4$F SOLUTION TO MAKE SURFACE OF SILICON SMOOTH IN ATOMIC ORDER

[75] Inventors: Kazutoshi Kaji, 1-9-16 Yagiyama-Minami, Taihaku-ku, Sendai-shi, 982; Shueh Lin Yau; Kingo Itaya, both of Sendai; Toshihiko Sakuhara, 2-18-13 Yagiyama-Higashi, Taihaku-ku, Sendai-shi, Miyagi-ken, 982, all of Japan

[73] Assignees: Research Development Corporation of Japan, Saitama-ken; Kazutoshi Kaji; Toshihiko Sakuhara, both of Miyagi-ken, all of Japan

[21] Appl. No.: 450,307

[22] Filed: May 25, 1995

[30] Foreign Application Priority Data

Jul. 1, 1994 [JP] Japan .................... 6-173467

[51] Int. Cl.$^6$ ........................................ C25F 3/12
[52] U.S. Cl. ................. 156/662.1; 205/656; 205/657; 205/683
[58] Field of Search .............. 156/662.1; 205/656, 205/657, 683

[56] References Cited

U.S. PATENT DOCUMENTS

| | | | |
|---|---|---|---|
| 4,482,443 | 11/1984 | Bacon et al. | 205/656 |
| 5,348,627 | 9/1994 | Propst et al. | 205/656 |

OTHER PUBLICATIONS

Itaya et al., "Atomic resolution images of H–terminated Si(111) surfaces in aqueous solutions", 18 May 1992, *Appl. Phys. Lett.*, vol. 60, No. 20, pp. 2534–2536.

*Primary Examiner*—Lee C. Wright
*Attorney, Agent, or Firm*—Webb Ziesenheim Bruening Logsdon Orkin & Hanson, P.C.

[57] ABSTRACT

A silicon substrate is etched by dipping it in a NH$_4$F solution while charging it with a potential more negative than an open-circuit potential. The NH$_4$F solution preferably has NH$_4$F concentration of 10M or less. The potential applied to the silicon substrate is controlled within the range of from the open-circuit potential to a more negative potential by −1.5 V vs. SCE. Since the etched silicon substrate has flatness in atomic order, it is suitable for the precise fabrications to manufacture high-density ir high-functional semiconductor devices.

3 Claims, 5 Drawing Sheets

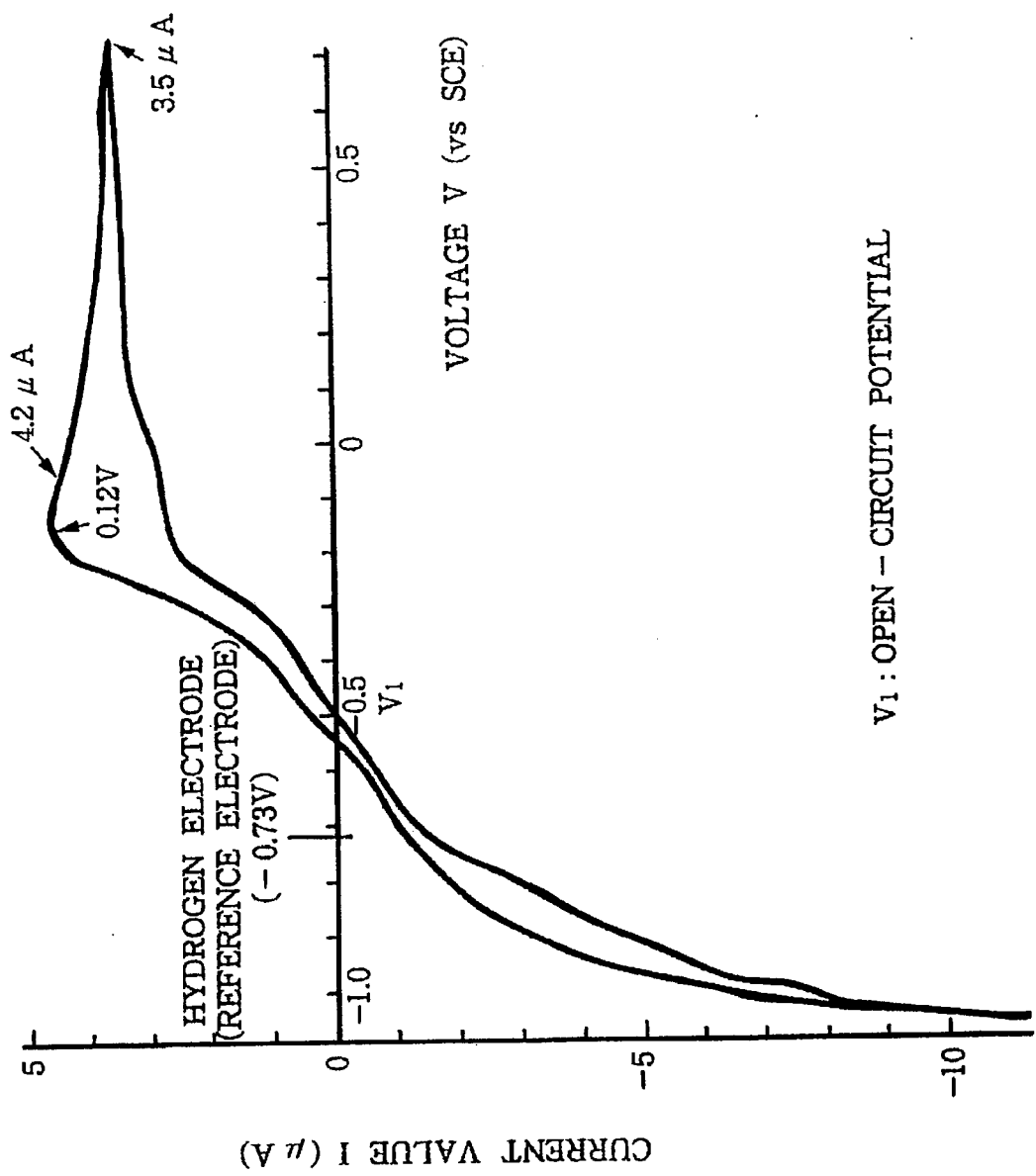

ETCHING METHOD USING NH₄F SOLUTION TO MAKE SURFACE OF SILICON SMOOTH IN ATOMIC ORDER

INDUSTRIAL APPLICATION

The present invention relates to an etching method enabling the precise working of a silicon material in atomic order necessary for very fine works in the process of manufacturing semiconductor devices or the like.

BACKGROUND OF THE INVENTION

The surface of a silicon substrate is reformed by etching to predetermined flatness suitable for the process of manufacturing a semiconductor device. The etching method is generally classified to wet and dry processes. The dry process necessitates the energy beam irradiation, resulting in the easy formation of various faults such as electrostatic damages and distortions which would unfavourably affect on the properties of an obtained device. The wet process substantially put less damage on an obtained device, since the surface of a silicon substrate is treated by chemical reaction, although the substrate would be contaminated with impurities carried from an etching solution or the formation of oxide films on the surface.

The oxidation on the surface is one of the problems in the wet process. In order to prevent the oxidation, there has been proposed the method wherein a unbound end existent on the outmost surface of a silicon substrate is terminated with hydrogen to inhibit the spontaneous formation of oxide films. The contamination with impurities has been almost eliminated, as the purity of pure water to be used becomes higher. The process used by Radio Corporation of America undermentioned is the representative wet process for cleaning a silicon substrate.

PRECLEANING

Precleaning is an optional step. In this step, a silicon substrate is treated with oxidation by plasma, an organic solvent, a heated $H_2O_2$—$H_2SO_4$ mixed solution or the like, to remove photoresist or other impurities from the surface of the substrate.

SC-1 CLEANING

The silicon substrate is then dipped in a $H_2O$—$H_2O_2$—$H_2SO_4$ mixed solution in a quartz beaker, while the mixed solution is being stirred. After the silicon substrated is held a few minutes in contact with the mixed solution heated at 75°–80° C., the silicon substrate is cooled by continuously washing with ultrapure water. The treated silicon substrate is carried to a rinsing tank, and rinsed with ultrapure water therein.

REMOVAL OF NATURAL OXIDE FILM FROM SURFACE OF SUBSTRATE

The rinsed silicon substrate is immediately dipped in a $H_2O$—HF mixed solution. Herein, the removal of natural oxide films can be detected by observing the phenomenon that the mixed solution is repelled from the surface of the substrate. Thereafter, the silicon substrate is rinsed with ultrapure water, and then carried to the next SC-2 cleaning step without making the surface of the substrate dry.

SC-2 CLEANING

A $H_2O$—$H_2O_2$—HCl mixed solution received in a quartz beaker is heated at 75°–80° C. The silicon substrate is dipped about fifteen minutes in the heated solution. Therereafter, the silicon substrate is cooled by washing with ultrapure water, and then rinsed with ultrapure water.

DRYING

The silicon substrate is disposed in a holder and then set in a centrifugal dryer. The substrate is rotatingly rinsed in the centrifugal dryer using ultrapure water heated at 80°–85° C. The rinsed substrate is then dried with high-temperature isopropyl alcohol vapor.

PROBLEMS TO BE SOLVED BY THE INVENTION

The RCA process contains the step for removing oxide films using an aqueous HF solution. Although oxide films are removed from the surface of the silicon substrate by the reaction with the HF solution, the surface is deformed to a rugged state in a few nanometer order. This kind of rugged substrate is inadequate in precise fabrications and the yield rate in precise fabrication is bad.

A silicon substrate is made to have flat surface in atomic order by etching it in an NH₄F solution, as disclosed in Applied Physics Lett. 60(1992), pp.2534–2536. It is supposed that the flattening effect is due to the remarkable difference in reactivity according to crystallographic directions during the etching reaction using the NH₄F solution compared with the HF solution.

SUMMARY OF THE INVENTION

The object of the present invention is to enhance the effect of the etching reaction using NH₄F by potential control and to enable an etching rate and/or an etching thickness in the level of an atomic layer.

According to the present invention, a silicon substrate dipped in a solution containing NH₄F is charged with a potential less than an open-circuit potential in the NH₄F-containing solution. The NH₄F concentration of the etching solution is preferably 10M or less. The potential to be applied to the silicon substrate is controlled within the range from the open-circuit potential to −1.5 V negatively potential than it.

BRIEF DESCRIPTION OF THE DRAWINGS

FIG. 1 shows a current-potential cyclicvoltamometory curve in the case where a silicon substrate is dipped in a NH₄F solution.

DETAILED DESCRIPTION OF THE INVENTION

Figure 2A:
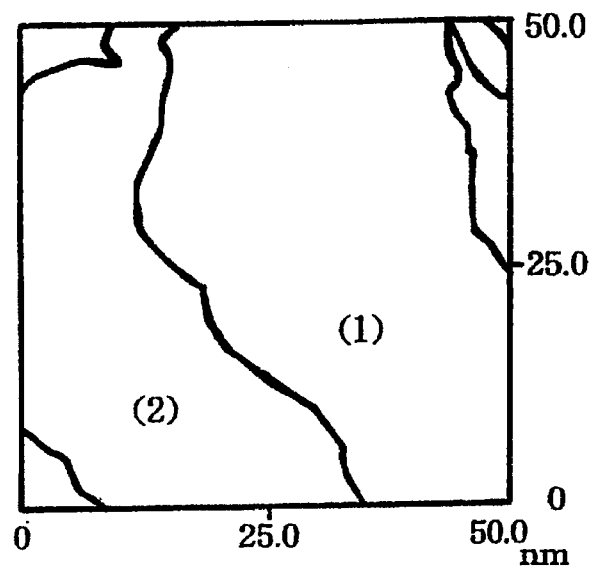
FIG. 2A is an STM (Scanning Tunneling Microscope) image showing the surface of a silicon piece etched 25 seconds in a 0.27M—NH₄F solution.

When type-n silicon is dipped in a 0.27M—NH₄F solution in the dark, there is noted a current-potential curve as shown in FIG. 1. FIG. 1 shows the measuring result in the case where a potential applied to silicon was swept at the scan rate of 50 mV/sec. The axis of abscissas represents the potential of silicon using a saturated calomel electrode (SCE) as a reference electrode, while the axis of ordinates represents an electric current of silicon electrode.

When a silicon piece is dipped in the solution, the silicon piece before being connected to a potential sweeping circuit shows a potential $V_1$ (hereinafter referred to as "open-circuit potential") against SCE. After the silicon piece is connected to the sweeping circuit, the potential of the silicon piece is preset at the open-circuit potential $V_1$. Thereafter, the potential is swept from the open-circuit potential toward a cathodic side. Hereby, a cathodic current flows to the silicon piece. However, when the potential of the silicon piece is swept from a value near the open-circuit potential $V_1$ toward an anodic side, an anodic current flows. When the potential is swept to approximately 0.8 V vs. SCE and then swept again toward the cathodic side, the electric current becomes nearly zero in the vicinity of the open-circuit potential $V_1$.

As shown in FIG. 1, an anodic current flows to the silicon piece at the anode side beyond the open-circuit potential $V_1$. This current flow means that oxidizing and dissolving reactions occur over the whole surface of the n-type silicon piece. As a result, a lot of pits are formed on the surface of the n-type silicon piece, so that the surface of the etched silicon piece is deformed to a much rugged state. Consequently, it is necessary to charge the n-type silicon with a potential more negative than the open-circuit potential $V_1$ in order to obtain an etched surface with excellent flatness.

When the n-type silicon piece is charged with a potential more negative than the open-circuit potential $V_1$, the oxidizing reaction on the surface of the silicon piece is suppressed, and ions such as $F^-$, $H^+$ and $OH^-$ in the etching solution are reacted with the surface of the silicon piece. That is, the etching reaction is continued while absorbing the ions on Si atoms at the outmost surface, so as to break the bonds between the Si atoms having absorbed the ions and other Si atoms closest thereto. Hereon, the bond number between the Si atoms at the outermost surface and other Si atoms most close thereto are different from each other according to the crystallographic directions of silicon crystal, and the degree of ion absorption is varied according to the crystallographic directions. Consequently, it is supposed that the silicon piece is etched layer by layer in atomic order.

The effect of the open-circuit potential $V_1$ on the etching of Si is common to other silicon substrates, except that the value of the open-circuit potential $V_1$ is changed in response to etching conditions such as the $NH_4F$ concentration of an etching solution to be used and the kind of silicon substrates to be etched.

When the $NH_4F$ concentration of the etching solution exceeds 11M, the etching reaction is rapidly promoted, and etching products such as $(NH_4F)_2SiF_6$ are excessively formed. If the etching solution is oversaturated with such etching products, the etching reaction would not be promoted anymore. In this regard, it is necessary to control the $NH_4F$ concentration of the etching solution not more than 11M.

On the other hand, when the silicon substrate is kept at an excessively negative potential, the surface of the silicon substrate is covered with generated hydrogen gas so as to impede the reaction between Si and the etching solution. Hereon, since the hydrogen gas is irregularily generated on the surface of the silicon substrate, the surface of the etched silicon substrate is deformed to a much rugged state. The harmful influence of the generated hydrogen gas is inhibited by charging the silicon substrate with the potential controlled within the range of from the open-circuit potential $V_1$ to (the open-circuit potential $V_1$–1.5 V).

EXAMPLE

Example 1

A n-type silicon piece was etched in a 0.27M—$NH_4F$ solution at various potentials. When the silicon piece was dipped in the $NH_4F$ solution held at a temperature of 20° C., its open-circuit potential was approximately −0.47 V vs. SCE. There was noted the current-potential curve in the dark as shown in FIG. 1.

When the potential of the silicon piece was adjusted to −0.3 V v.s. SCE, the etching reaction was rapidly promoted. In this case, the etched silicon piece did not have a flat surface in atomic order. On the other hand, the voltage of the silicon piece was adjusted to −2.0 V v.s. SCE, hydrogen bubbles were generated from the surface of the silicon piece. In this case, the surface of the etched silicon piece was converted to an excessively rugged state.

When the potential of the silicon piece was adjusted to −1.04 V v.s. SCE, the surface of the silicon piece was etched layer by layer in atomic order while maintaining its flatness. The process to gradually etching on the (111) surface of the silicon piece was observed every 25 seconds by Scanning Tunneling Microscope (STM). The results were shown in FIGS. 2A to 2C.

Figure 2B:
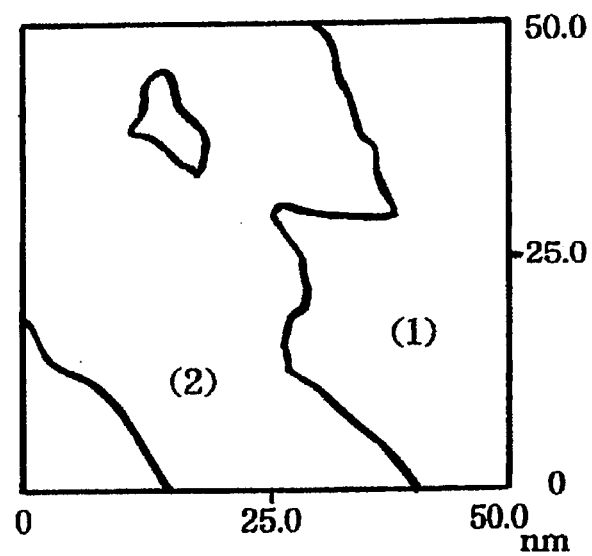
FIG. 2B is an STM image showing the surface of a silicon piece etched 50 seconds in a 0.27M—NH₄F solution.
Figure 2C:
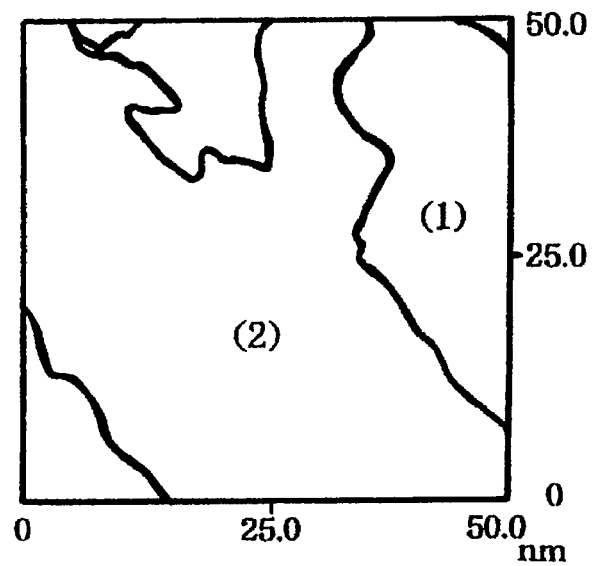
FIG. 2C is an STM image showing the surface of a silicon piece etched 75 seconds in a 0.27M—NH₄F solution.

In FIGS. 2A to 2C, the areas (1) and (2) were flat plateaus in atomic order. The plateau (1) was higher than the plateau (2) by approximately 0.3 nm corresponding to one atomic layer of the (111) surface of the silicon piece. Since the isohypse did not change during the lapse of time from FIG. 2A to FIG. 2C, it is supposed that each plateau (1), (2) kept its atomic order flatness. As a result, it is recognized that the surface of the silicon piece was etched layer by layer while keeping the atomic order flatness by adjusting the potential of the silicon piece at −1.04 V v.s. SCE.

Example 2

Figure 3:
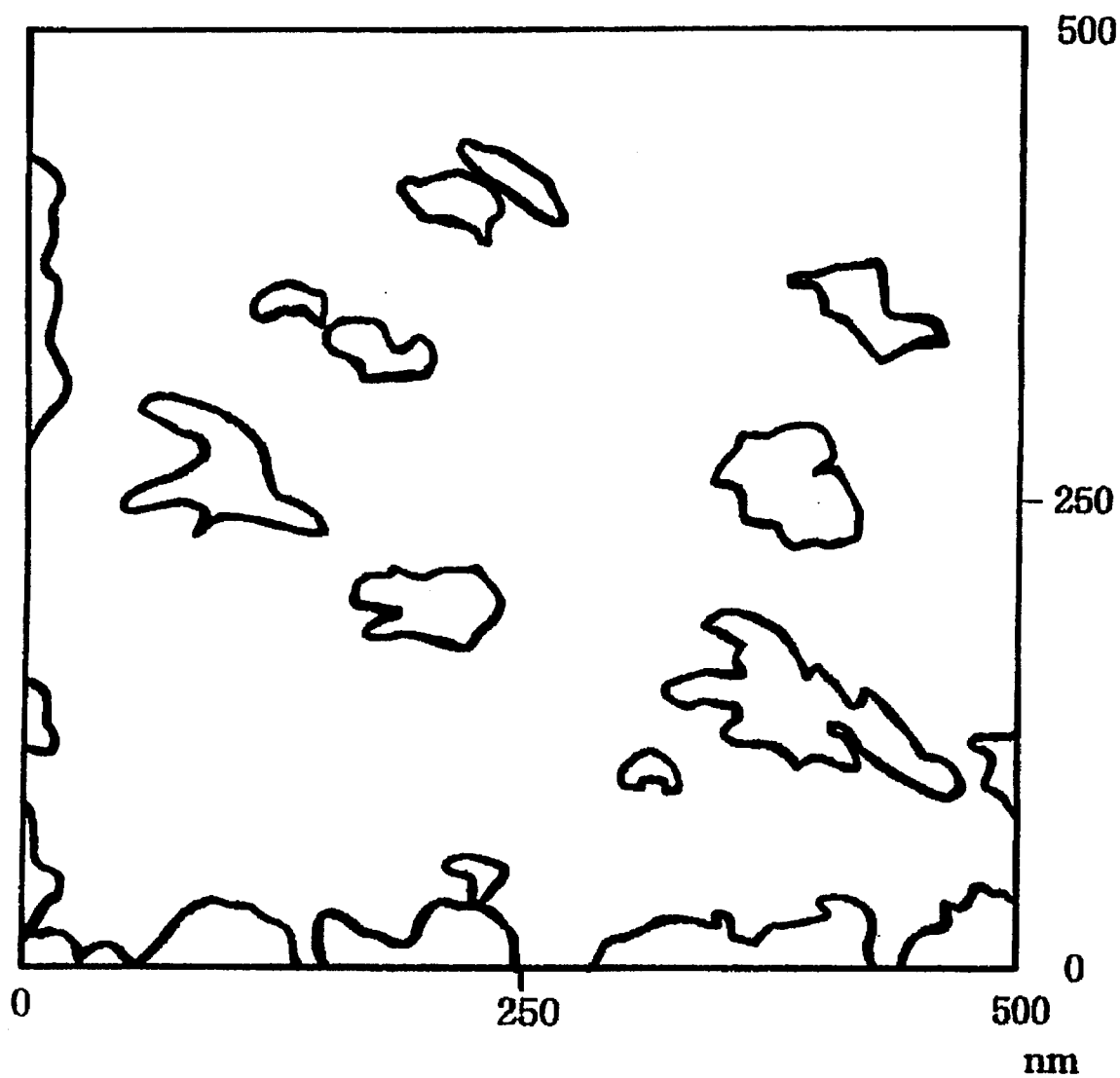
FIG. 3 is an STM image showing the surface of a silicon piece etched in a 11M—NH₄F solution.

A n-type silicon piece was etched using 11M—$NH_4F$ solution while changing potential variously. The open-circuit potential $V_1$ of the silicon piece in the $NH_4F$ solution was approximately −0.97 V vs. SCE. When the voltage of the silicon piece was kept at −1.22 V vs. SCE, the etching reaction was not promoted. When the voltage of the silicon piece was kept at −0.82 V vs. SCE, rugged layers or deposit-like islands were formed, as shown in FIG. 3 on the whole surface of the silicon piece. These etching results means that the 11M—$NH_4F$ solution was inadequate to etch the surface of the silicon piece layer by layer while keeping the flatness in atomic order.

On the contrary, when the n-type silicon piece was etched using a 0.1M—$NH_4F$ solution, it was recognized from the STM observation that the surface of the silicon piece was etched layer by layer while keeping the flatness in atomic order. The open-circuit potential $V_1$ of the silicon piece in this $NH_4F$ solution was approximately −0.31 V vs. SCE.

Figure 4A:
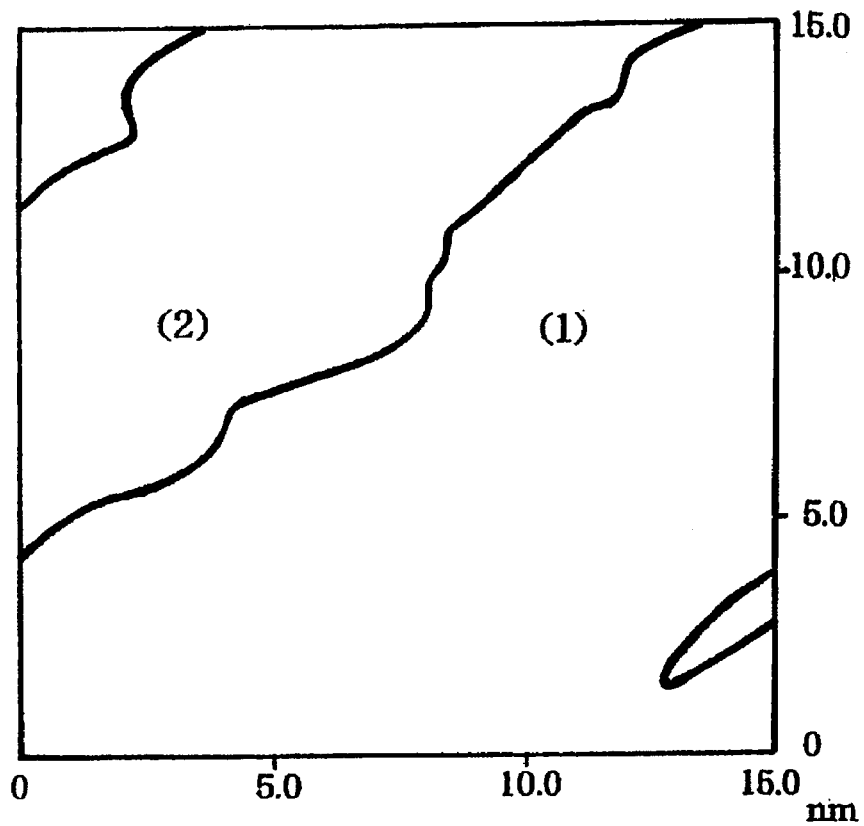
FIG. 4A is an STM images showing the surface of a silicon piece etched 12 seconds in a 0.1M—NH₄F solution.
Figure 4B:
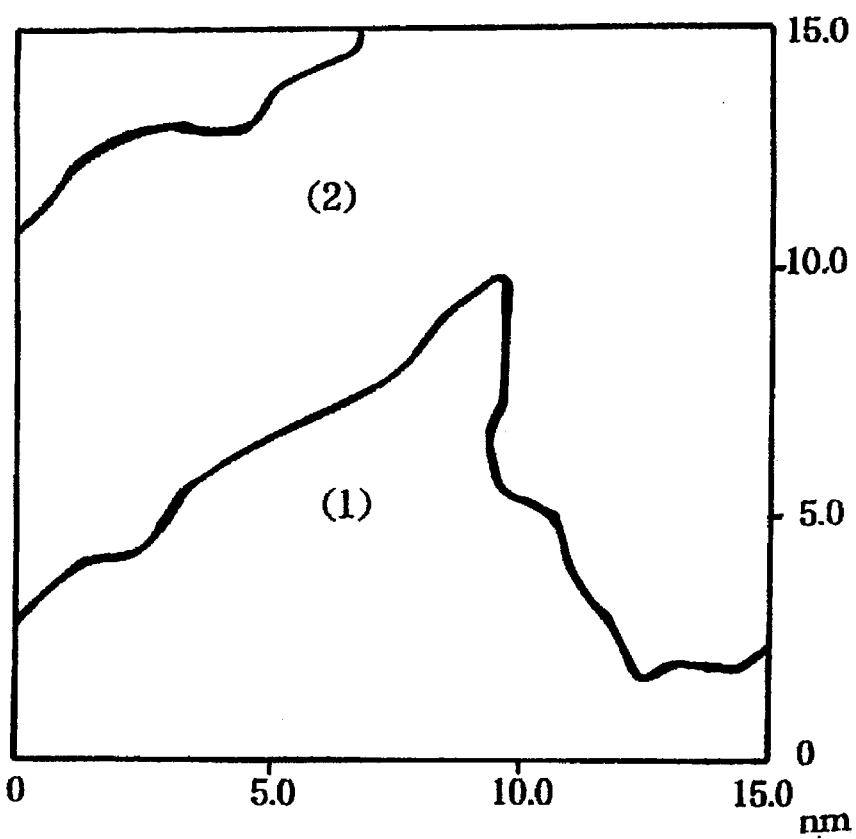
FIG. 4B is an STM images showing the surface of a silicon piece etched 24 seconds in a 0.1M—NH₄F solution.

The progress of etching the (111) surface of the silicon piece while keeping the potential of the silicon piece at −0.86 V v.s. SCE was observed every 12 seconds by STM. The observation results are shown in FIGS. 4A and 4B. The surface of the silicon piece was progressively etched from FIG. 4A to FIG. 4B. The plateau (1) was higher than the plateau (2) by approximately 0.3 nm as the same as in Example 1. Since the etching state is changed from FIG. 4A to FIG. 4B, it is noted that the silicon piece kept its atomic order flatness. In this case, the plateau (2) kept the atomic order flatness without being etched, after the plateau (1) was removed. This result means the valuable function of the 0.1M—$NH_4F$ solution to etch the surface of the silicon piece layer by layer while keeping the atomic order flatness of the silicon piece by setting the voltage of the silicon piece at −0.86 V vs. SCE.

Example 3

A silicon piece can be etched while keeping the atomic order flatness in an etching solution containing $NH_4OH$ and/or HF in addition to $NH_4F$. For instance, $NH_4F$ and $NH_4OH$ were mixed together with the ratio of 40% $NH_4F$:$NH_4OH$ (28% calculated as $NH_3$)=10:1, and then diluted with pure water so as to adjust the concentration of $NH_4F$ to 0.27M. A n-type silicon piece was dipped in the solution prepared in this way. The open-circuit potential of the silicon piece in the solution was approximately −0.71 V vs. SCE.

Figure 5A:
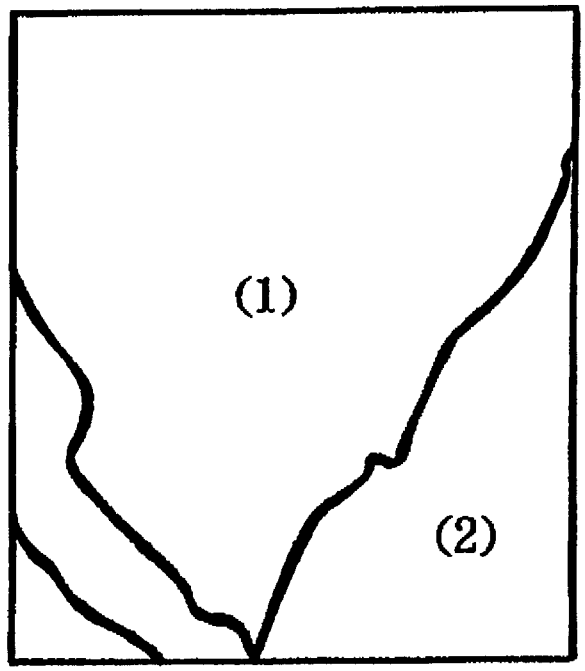
FIG. 5A is an STM image showing the surface of a silicon piece etched 12 seconds in a 0.27M—NH₄F solution.
Figure 5B:
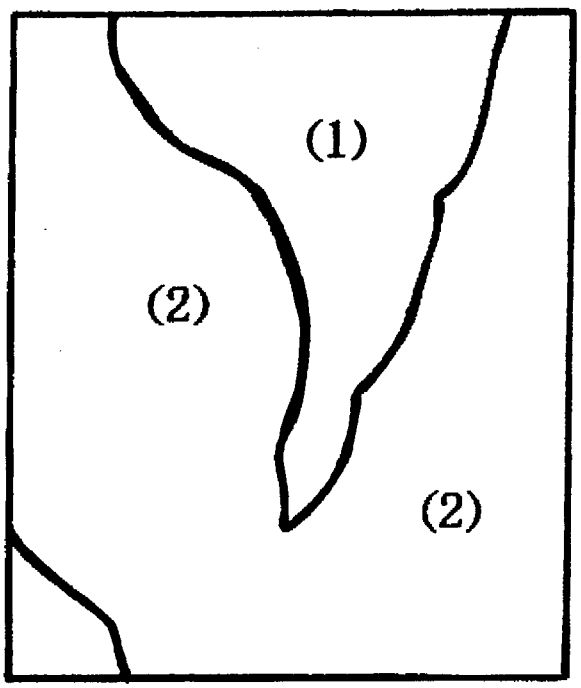
FIG. 5B is an STM image showing the surface of a silicon piece etched 24 seconds in a 0.27M—NH₄F solution.

The potential of the silicon piece was kept at −1.2 V vs. SCE in the $NH_4F$—$NH_4OH$ solution. The progress of etching the (111) surface of the silicon piece was observed every 12 seconds by STM. The observation results are shown in FIGS. 5A and 5B. It is recognized from FIGS. 5A and 5B that the (111) surface of the silicon piece was gradually etched layer by layer while keeping the atomic order flatness in this case, too.

Each areas (1) and (2) was a plateau having flatness in atomic order. The plateau (1) was higher than the plateau (2) by approximately 0.3 nm as the same as in Example 1. The progress of etching from FIG. 5A to FIG. 5B means that each plateau (1) and (2) kept the atomic order flatness. The atomic order flatness of the plateau (2) was kept as such without being etched, after the plateau (1) was etched. Consequently, it is recognized that the 0.27M—$NH_4F$ solution exhibited the valuable effect to etch the surface of the silicon piece layer by layer while keeping the atomic order flatness by adjusting the potential of the silicon piece to −1.2 V vs. SCE.

According to the present invention as aforementioned, a silicon substrate is etched in a solution containing $NH_4F$ under the condition that the silicon substrate is charged with a potential more negative than the open-circuit potential. A cathodic current effective in the moderation of etching reaction is applied to the silicon substrate by charging the silicon substrate with said potential. The cathodic current is effective in making the etching reaction uniform on the whole surface of the silicon substrate. Consequently, the silicon substrate is gradually etched layer by layer while keeping its flatness in atomic order. Since the silicon substrate etched in this way has a surface excellent in flatness, the silicon substrate is suitable for precise working necessary in the process of manufacturing high-density or high-functional semiconductor devices.

What is claimed is:

1. A method of etching silicon comprising:
   dipping a Si substrate in an aqueous solution containing $NH_4F$, and charging in darkness said Si substrate with a potential more negative than the open-circuit potential which appears when said silicon substrate is not connected to an electric circuit, so as to etch said Si substrate in said solution containing $NH_4F$.

2. The etching method according to claim 1, using the solution containing $NH_4F$ at the concentration of 10M or less.

3. The etching method according to claim 1, wherein the silicon substrate is charged with a potential within the range of from an open-circuit potential to a more negative potential by −1.5 V vs. a saturated calomel electrode.

* * * * *